United States Patent
Cadouri

(10) Patent No.: US 7,440,869 B1
(45) Date of Patent: Oct. 21, 2008

(54) MAPPING YIELD INFORMATION OF SEMICONDUCTOR DICE

(75) Inventor: Eitan Cadouri, Cupertino, CA (US)

(73) Assignee: PDF Solutions, Inc., San Jose, CA (US)

( * ) Notice: Subject to any disclaimer, the term of this patent is extended or adjusted under 35 U.S.C. 154(b) by 147 days.

(21) Appl. No.: 10/854,970

(22) Filed: May 26, 2004

(51) Int. Cl.
*G06F 19/00* (2006.01)

(52) U.S. Cl. .......................... 702/179; 438/5

(58) Field of Classification Search ................. 702/179, 702/59, 117, 118, 182–185, 188; 324/512; 438/10, 12, 5, 17, 18
See application file for complete search history.

(56) References Cited

U.S. PATENT DOCUMENTS

| | | | | |
|---|---|---|---|---|
| 5,598,341 | A * | 1/1997 | Ling et al. | 700/110 |
| 6,345,211 | B1 * | 2/2002 | Yu | 700/121 |
| 6,393,602 | B1 | 5/2002 | Atchison et al. | |
| 6,545,369 | B1 * | 4/2003 | Hatab | 257/797 |
| 6,777,677 | B2 * | 8/2004 | Nozoe et al. | 250/310 |
| 7,013,192 | B2 | 3/2006 | Whitefield et al. | |
| 2004/0138846 | A1 * | 7/2004 | Buxton et al. | 702/108 |

* cited by examiner

*Primary Examiner*—Edward Raymond
(74) *Attorney, Agent, or Firm*—Morrison & Foerster LLP

(57) ABSTRACT

In one exemplary embodiment, yield information of semiconductor dice is mapped by obtaining yield information of a first die that was formed on a first location on a first wafer. Yield information is obtained of a second die that was formed on a second location on a second wafer. A portion of the first location corresponds to a portion of the second location such that the portion of the first location would overlap with the portion of the second location if the first location was on the second wafer. A plurality of pixel elements is defined. Each pixel element corresponds to a different location on a wafer, and at least one of the plurality of pixel elements corresponds to the portion of the first location that corresponds to the portion of the second location. An average yield is determined for the at least one of the plurality of pixel elements based on the yield information of the first die and the second die. A deviation is determined for the at least one of the plurality of pixel elements based on the average yield of the at least one of the plurality of pixel elements and the yield information of the first die and the second die.

45 Claims, 6 Drawing Sheets

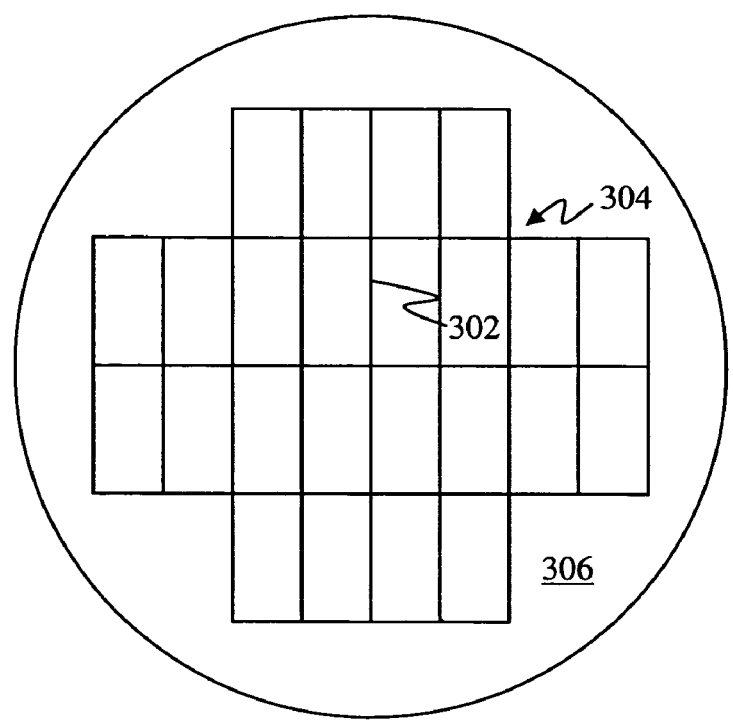
FIG. 3-A
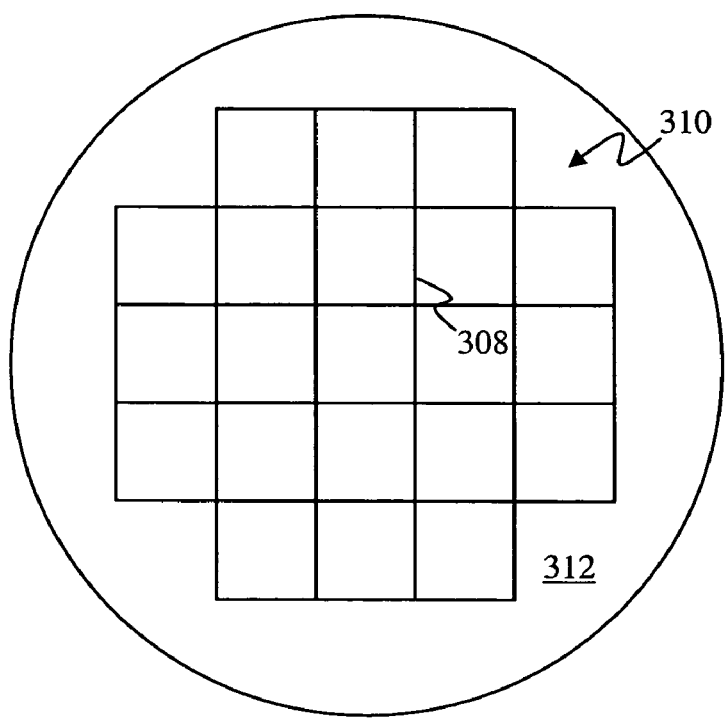
FIG. 3-B

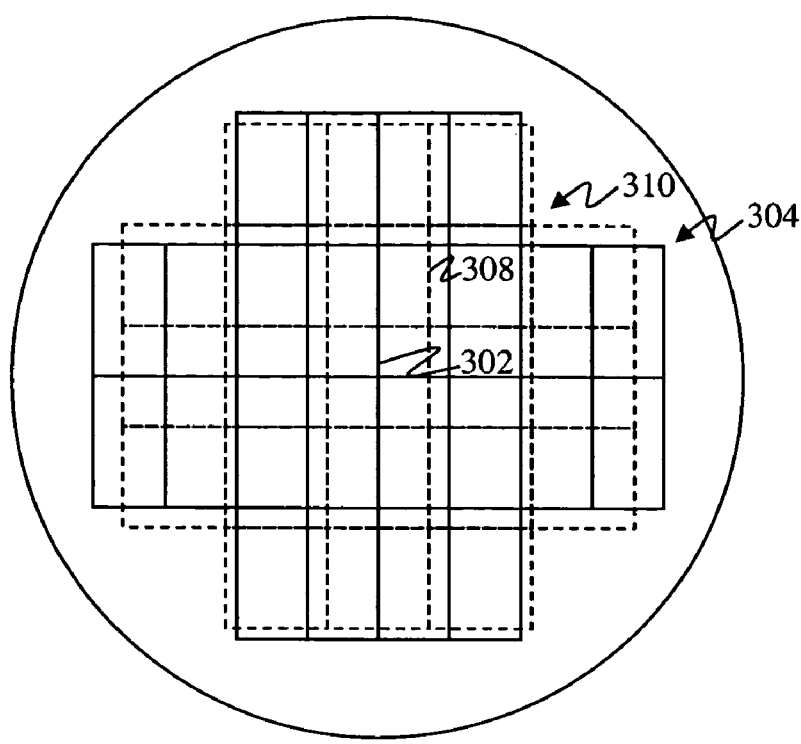
FIG. 3-C
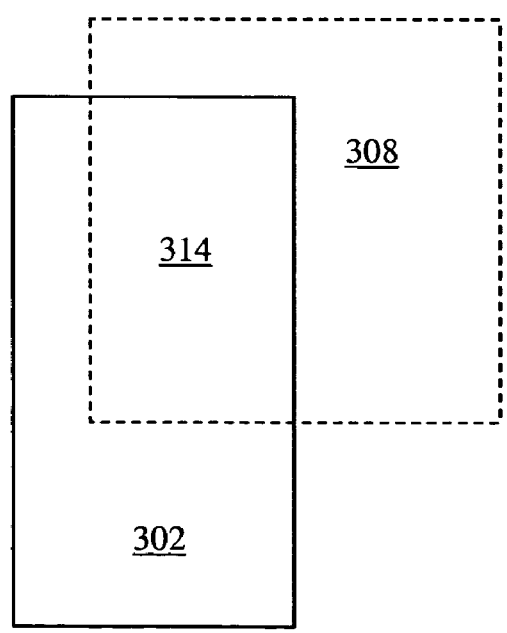
FIG. 3-D

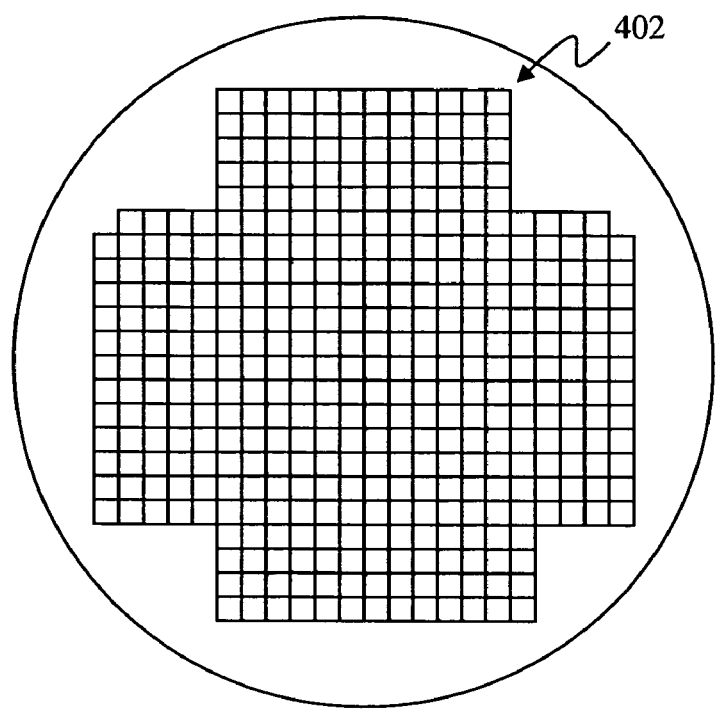
FIG. 4-A
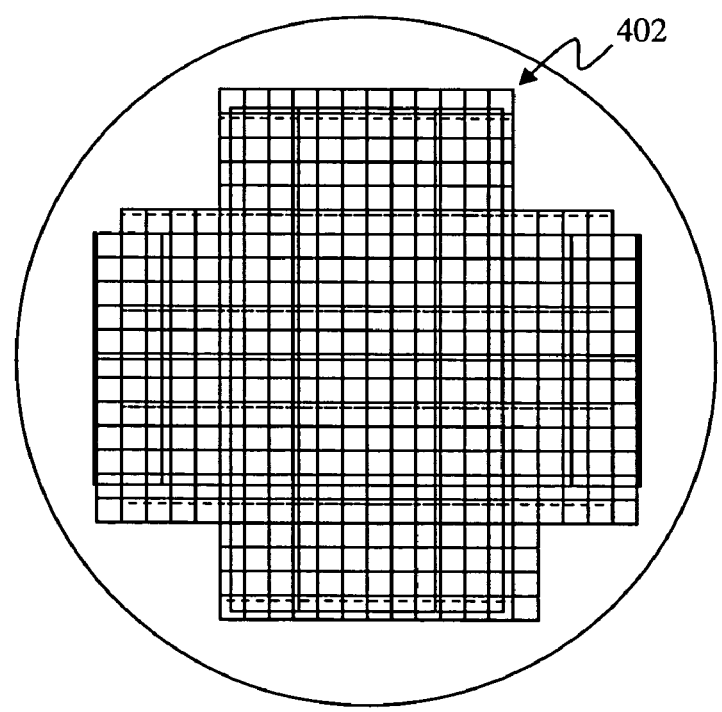
FIG. 4-B

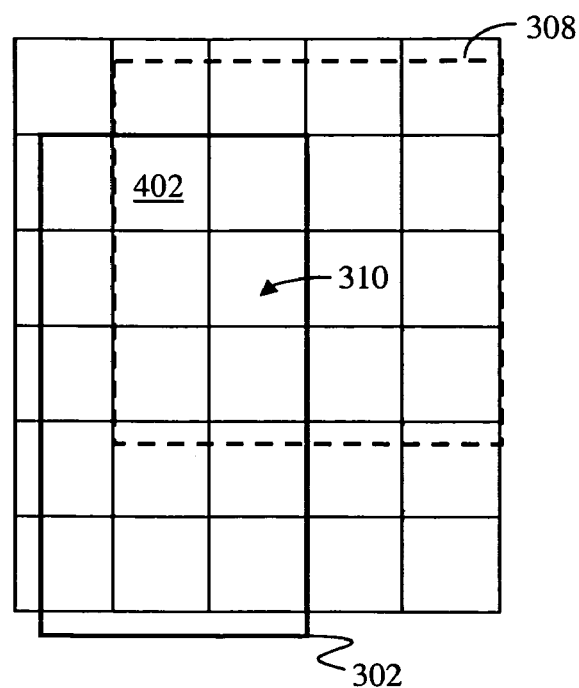
FIG. 4-C
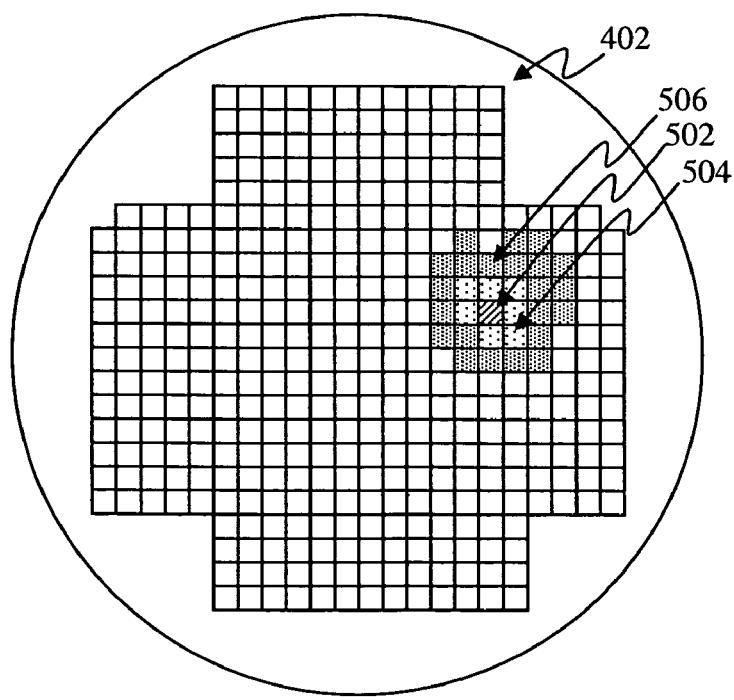
FIG. 5

MAPPING YIELD INFORMATION OF SEMICONDUCTOR DICE

BACKGROUND

1. Field

The present application relates to semiconductor dice manufacturing, and more particularly to mapping yield information of semiconductor dice.

2. Related Art

Semiconductor devices are typically manufactured by fabricating the devices on a semiconductor wafer. An individual device is formed as a die on the wafer using known semiconductor fabrication processes. Depending on the size of the die, a single wafer can contain hundreds of dice. The dice are generally arranged in a pattern (i.e., a die placement) on the wafer to maximize the number of dice on the wafer.

After the dice are fabricated on the wafer, the dice are electrically tested. Dice that pass the electrical testing are sorted from the dice that fail the electrical testing. While semiconductor manufacturers collect yield information of the semiconductor dice, such as the number of dice that pass and fail the electrical testing, they often make limited use of the collected yield information.

SUMMARY

In one exemplary embodiment, yield information of semiconductor dice is mapped by obtaining yield information of a first die that was formed on a first location on a first wafer. Yield information is obtained of a second die that was formed on a second location on a second wafer. A portion of the first location corresponds to a portion of the second location such that the portion of the first location would overlap with the portion of the second location if the first location was on the second wafer. A plurality of pixel elements is defined. Each pixel element corresponds to a different location on a wafer, and at least one of the plurality of pixel elements corresponds to the portion of the first location that corresponds to the portion of the second location. An average yield is determined for the at least one of the plurality of pixel elements based on the yield information of the first die and the second die. A deviation is determined for the at least one of the plurality of pixel elements based on the average yield of the at least one of the plurality of pixel elements and yield information of the first die and the second die.

DESCRIPTION OF DRAWING FIGURES

The present application can be best understood by reference to the following description taken in conjunction with the accompanying drawing figures, in which like parts may be referred to by like numerals:

FIG. 3-A is a top view of an exemplary wafer having dice arranged in accordance with an exemplary die placement;

FIG. 3-B is a top view of another exemplary wafer having dice arranged in accordance with another exemplary die placement;

FIG. 3-C depicts the exemplary die placement depicted in FIG. 3-A superimposed with the exemplary die placement depicted in FIG. 3-B;

FIG. 3-D depicts a portion of FIG. 3-C;

FIG. 4-A depicts exemplary pixel elements;

FIG. 4-B depicts the exemplary pixel elements depicted in FIG. 4-A superimposed with the exemplary die placement depicted in FIG. 3-A and the exemplary die placement depicted in FIG. 3-B;

FIG. 4-C depicts a portion of FIG. 4-B;

FIG. 5 depicts exemplary groupings of pixel elements; and

Figure 6:
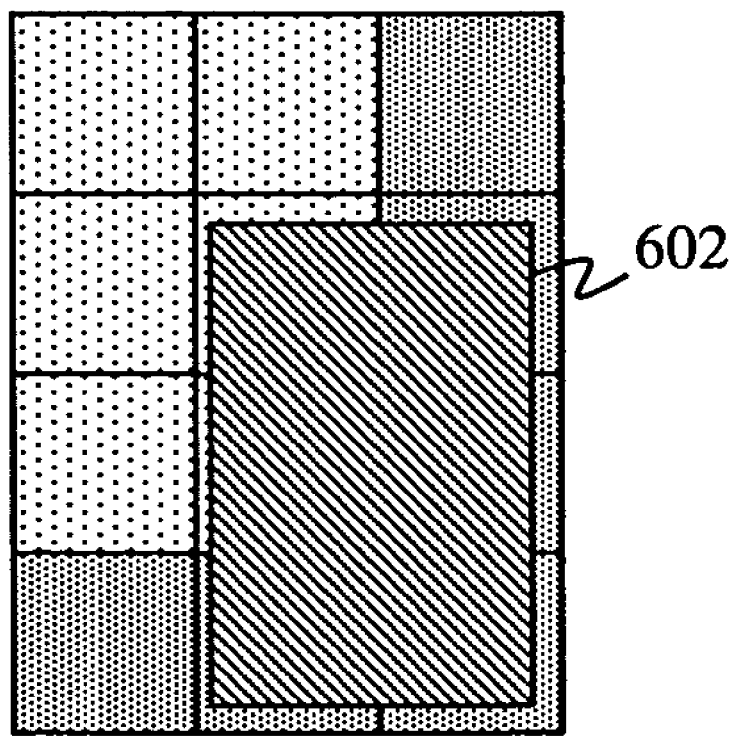

FIG. 6 depicts an exemplary die placed with the pixel elements.

DETAILED DESCRIPTION

The following description sets forth numerous specific configurations, parameters, and the like. It should be recognized, however, that such description is not intended as a limitation on the scope of the present invention, but is instead provided as a description of exemplary embodiments.

Figure 1:
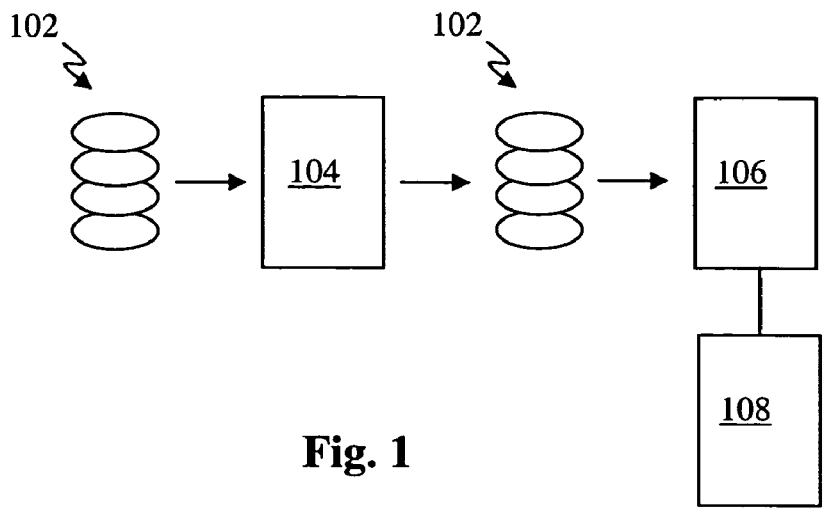
FIG. 1 is a block diagram of an exemplary semiconductor manufacturing and testing process.

With reference to FIG. 1, a plurality of semiconductor wafers 102 can be processed using a processing tool 104 to form integrated circuits as dice on wafers 102. After the dice are formed on wafers 102, a tester 106 performs one or more tests on the dice. In general, dice that fail the one or more tests are marked and discarded. Yield information, such as the number of dice that pass or fail the one or more tests, can be used to monitor, adjust, and optimize processing tool 104. It should be recognized that wafers 102 can be processed using any number of processing tools, and tested using any number of testers.

Figure 2:
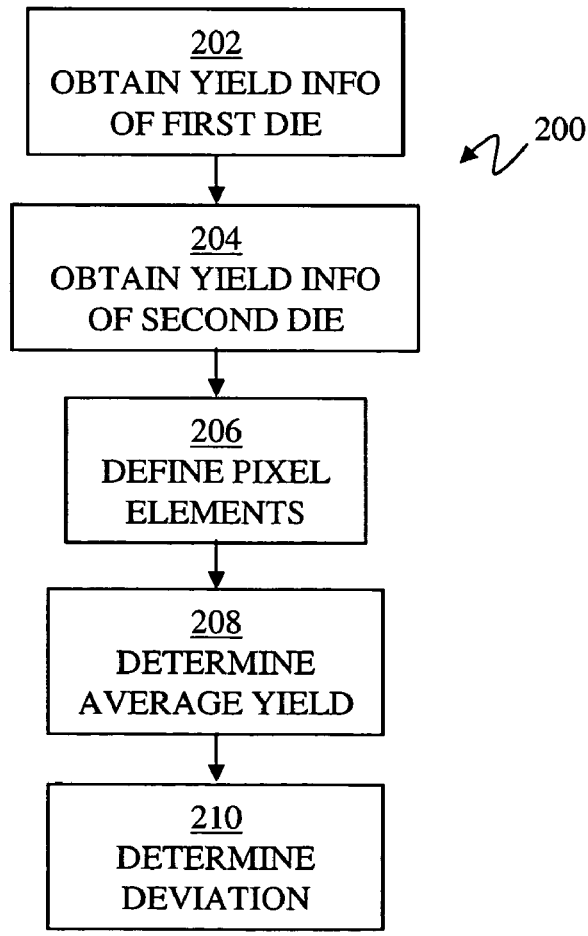
FIG. 2 is a flow diagram of an exemplary process of mapping yield information of semiconductor dice.

With reference to FIG. 2, an exemplary process 200 is depicted of mapping yield information of dice. In step 202, yield information of a first die that was formed on a first location on a first wafer is obtained. For example, with reference to FIG. 3-A, assume a plurality of dice 302 are formed on a wafer 306. As depicted in FIG. 3-A, dice 302 can be arranged on locations on wafer 306 in accordance with a die placement 304. Thus, in this example, in accordance with step 202 (FIG. 2), after a die is formed on wafer 306, the die is tested, and yield information, such as whether the die passed the test, is obtained.

With reference to FIG. 2, in step 204, yield information of a second die that was formed on a second location on a second wafer is obtained. For example, with reference to FIG. 3-B, assume a plurality of dice 308 are formed on a wafer 312. As depicted in FIG. 3-B, dice 308 can be arranged on locations on wafer 312 in accordance with a die placement 310. Thus, in this example, in accordance with step 204 (FIG. 2), after a die is formed on wafer 312, the die is tested, and yield information, such as whether the die passed the test, is obtained.

With reference to FIGS. 3-A and 3-B, in one exemplary embodiment, a portion of the first location of the first die (such as one of the plurality of dice 302 formed on wafer 306) corresponds to a portion of the second location of the second die (such as one of the plurality of dice 308 formed on wafer 312) such that the portion of the first location would overlap with the portion of the second location if the first location was on the second wafer. For example, with reference to FIG. 3-C, die placement 304 is depicted superimposed with die placement 310. As depicted in FIG. 3-C, the locations of dice 302 overlap with the locations of dice 308. More particularly, with reference to FIG. 3-D, one die 302 from die placement 304 (FIG. 3-C) is depicted with one die 308 from die placement 310 (FIG. 3-C). As depicted in FIG. 3-D, a portion of the location of die 302 overlaps with a portion of the location of die 308, which is depicted as location 314.

In the present exemplary embodiment, as depicted in FIGS. 3-A to 3-D, the first die and the second die can have different sizes. As also depicted in FIGS. 3-A to 3-D, the first die and the second die can have different placements (e.g., die placement 304 is different than die placement 310). Additionally, the first die and the second die can be different products produced by the same process (e.g., wafer 306 and wafer 312 can be processed using the same processing tool 104 (FIG. 1)).

With reference to FIG. 2, in step 206, a plurality of pixel elements are defined. Each pixel element corresponds to a different location on a wafer, and at least one of the pixel elements corresponds to the portion of the first location of the first die that corresponds to the portion of the second location of the second die. For example, with reference to FIG. 4-A, a plurality of pixel elements 402 are depicted. As depicted in FIG. 4-A, each pixel element 402 corresponds to a different location on a wafer. With reference to FIG. 4-B, plurality of pixel elements 402 is depicted superimposed with die placement 304 (FIG. 3-A) and die placement 310 (FIG. 3-B). With reference to FIG. 4-C, a portion of plurality of pixel elements 402 are depicted superimposed on one die 302 from die placement 304 (FIG. 3-A) and one die 308 from die placement 310 (FIG. 3-B). As depicted in FIG. 4-C, at least one pixel element 402 corresponds to the portion of the location of die 302 that overlaps with the portion of the location of die 308.

With reference to FIG. 2, in step 208, an average yield for the at least one pixel element from step 206 is determined based on the yield information of the first die and the second die obtained in steps 202 and 204. For example, with reference to FIG. 4-C, assume that the yield of die 302 is 20 percent and the yield of die 308 is 10 percent, then the average yield of pixel element 402 in the location of die 302 that overlaps with the location of die 308 is 15 percent. It should be recognized that yield information can be obtained in various forms. For example, yield information can be obtained from a semiconductor manufacturer in a publishable form, such as normalized values. For a more detailed description of transforming yield information, see U.S. patent application Ser. No. 10/803,787, titled TRANSFORMING YIELD INFORMATION OF A SEMICONDUCTOR FABRICATION PROCESS, filed Mar. 17, 2004, which is incorporated herein by reference in its entirety.

It should also be recognized that the yield information of the first die and the second die obtained in steps 202 and 204 can be transformed before determining the average yield in step 208. For example, if the yield information obtained in steps 202 and 204 are not normalized, a normalization step can be included prior to determining the average yield in step 208. The yield information of the first die and the second die can be normalized using a linear or nonlinear function that takes into account average yield.

In some circumstances, determining the average yield in step 208 based on normalized yields rather than actual yields can more accurately characterize the performance of the fabrication process. For example, assume that the yield information obtained in steps 202 and 204 for the first die and the second die are the actual yields of the first die and the second die. As a numerical example, assume that the first die is formed on 100 wafers and tested, and only 10 of the 100 dice passed, which corresponds to an actual yield of 10 percent. Assume that the second die is also formed on 100 wafers and tested, and 90 of the 100 dice passed, which corresponds to an actual yield of 90 percent. Thus, the average yield determined based on the actual yields of the first die and the second is 50 percent. Now assume that 100 of the first die are fabricated on each of the 100 wafers, and 1,100 of the 10,000 dice passed, which corresponds to an average yield for the first die of 11 percent. Thus, the normalized yield of the first die is about 91 percent. Assume that 100 of the second die are fabricated on each of the 100 wafers, and 9,200 of the 10,000 dice passed, which corresponds to an average yield for the second die of 92 percent. Thus, the normalized yield of the second die is about 98 percent. The average yield based on the normalized yields is 94.5 percent. Now assume that the first die and the second die are different products produced by the same fabrication process. If the low actual yield of the first die and the high actual yield of the second die are primarily related to the difference in pixel element 402 in the location of die 302 that overlaps with the location of die 308 is 15 percent. It should be recognized that yield information can be obtained in various forms. For example, yield information can be obtained from a semiconductor manufacturer in a publishable form, such as normalized values. For a more detailed description of transforming yield information, see U.S. patent application Ser. No. 10/803,787, titled TRANSFORMING YIELD INFORMATION OF A SEMICONDUCTOR FABRICATION PROCESS, filed Mar. 17, 2004, which is incorporated herein by reference in its entirety.

It should also be recognized that the yield information of the first die and the second die obtained in steps 202 and 204 can be transformed before determining the average yield in step 208. For example, if the yield information obtained in steps 202 and 204 are not normalized, a normalization step can be included prior to determining the average yield in step 208. The yield information of the first die and the second die can be normalized using a linear or nonlinear function that takes into account average yield.

In some circumstances, determining the average yield in step 208 based on normalized yields rather than actual yields can more accurately characterize the performance of the fabrication process. For example, assume that the yield information obtained in steps 202 and 204 for the first die and the second die are the actual yields of the first die and the second die. As a numerical example, assume that the first die is formed on 100 wafers and tested, and only 10 of the 100 dice passed, which corresponds to an actual yield of 10 percent. Assume that the second die is also formed on 100 wafers and tested, and 90 of the 100 dice passed, which corresponds to an actual yield of 90 percent. Thus, the average yield determined based on the actual yields of the first die and the second is 50 percent. Now assume that 100 of the first die are fabricated on each of the 100 wafers, and 1,100 of the 10,000 dice passed, which corresponds to an average yield for the first die of 11 percent. Thus, the normalized yield of the first die is about 91 percent. Assume that 100 of the second die are fabricated on each of the 100 wafers, and 9,200 of the 10,000 dice passed, which corresponds to an average yield for the second die of 92 percent. Thus, the normalized yield of the second die is about 98 percent. The average yield based on the normalized yields is 94.5 percent. Now assume that the first die and the second die are different products produced by the same fabrication process. If the low actual yield of the first die and the high actual yield of the second die are primarily related to the difference in design of the first die and the second die (e.g., the features and acceptable tolerances of the first die may be smaller in comparison to the second die), the average yield determined based on the normalized yields (i.e., 94.5 percent) is a more accurate characterization of the performance of the fabrication process than the average yield determined based on the actual yields (i.e., 50 percent).

With reference to FIG. 2, in step 210, a deviation for the at least one pixel element from step 206 is determined based on the average yield determined in step 208 and the yield information of the first die and the second die obtained in steps 202 and 204. For example, with reference to FIG. 4-C, assuming that the average yield of pixel element 402 is 15 percent, the yield of 302 is 20 percent and the yield of die 308 is 10 percent, then the deviation is 5 percent. Although in this example a standard deviation was used as a measure of deviation, it should be recognized that various measures of deviation or variation can be used.

In one exemplary implementation, with reference to FIG. 2, step 202 can be repeated to obtain yield information of a first set of dice formed on locations on the first wafer, such as dice 302 of die placement 304 (FIG. 3-A). Step 204 can be repeated to obtain yield information of a second set of dice formed on locations on the second wafer, such as dice 308 of die placement 310 (FIG. 3-B). In the present exemplary embodiment, as depicted in FIG. 3-C, the locations on the first wafer can correspond with locations on the second wafer such that the locations on the first wafer would overlap with locations on the second wafer if the locations on the first wafer were on the second wafer. As depicted in 4-B, the plurality of pixel elements 402 correspond to the overlapping locations.

In the present exemplary implementation, an average yield for each of the plurality of pixel elements 402 is determined based on the yield information of the first set of dice (dice 302 of die placement 304 (FIG. 3-A)) and the second set of dice (dice 308 of die placement 304 (FIG. 3-B)). A deviation for each of the plurality of pixel elements 402 is also determined based on the yield information of the first set of dice (dice 302 of die placement 304 (FIG. 3-A)) and the second set of dice (dice 308 of die placement 304 (FIG. 3-B)).

In one exemplary implementation, with reference to FIG. 2, steps 202 and 204 can be repeated to obtain yield information of a plurality of additional sets of dice formed on locations on a plurality of additional wafers, where the locations on the plurality of additional wafers overlap. The plurality of additional sets of dice can be of different products, which can include tens, hundreds, and thousands of different products, produced using the same fabrication process. The plurality of pixel points defined in step 206 correspond to the overlapping locations. The average yield and the deviation for each of the plurality of pixel elements are determined based on the yield information of the plurality of additional sets of dice.

In the present exemplary implementation, the average yield for a pixel element is determined as a sum of the yield information of all the dice in a location corresponding to the pixel element divided by the number of dice in the location. The deviation for the pixel is determined as a percentage of deviation of the yield information of all the dice in the location.

With reference to FIG. 5, in the present exemplary embodiment, after average yields and deviations are determined for the plurality of pixel elements 402, a location of interest is identified. The location of interest can correspond to a location on a wafer that interacts with a processing equipment used to process the wafer, such as a clamp, wafer scribe, wafer identification, nitride injector, and the like. The location of interest can correspond to a location on a wafer specified by a user. The location of interest can also correspond to a pixel element having an average yield that is less than an established limit.

After a location of interest is identified, pixel elements around the identified location of interest are grouped based on the average yield and deviation of the pixel elements. For example, pixel elements can be grouped together that have: 1) the same average yields and deviations; 2) the same average yield and deviations within ranges of values; 3) average yields within ranges of values and the same deviations; or 4) average yields and deviations within ranges of values. The grouping of pixel elements around the location of interest can be ceased when the average yields or the deviations of the pixel elements are greater than an established limit.

For example, as depicted in FIG. 5, assume that a location of interest 502 is identified. Assume that pixel elements around location of interest 502 that have average yields within ranges of values and the same deviations are grouped together. For example, assume that a first grouping of pixel elements 504 includes pixel elements with yields between 0 and 10 percent and a deviation of 0 percent. Assume also that a second grouping of pixel elements 506 includes pixel elements with yields greater than 10 and less than 20 percent and a deviation of 10 percent. In this manner, the plurality of pixel elements 402 can be divided into different zones by grouping pixel elements 402 around locations of interest.

In the present exemplary embodiment, the pixel elements can be used in determining a placement of a die. In particular, the average yield and deviation associated with the pixel elements in the location in which the die is to be place can predict the likely yield of the die in that location. For example, with reference to FIG. 6, a die 602 is depicted as being placed in a selected location. The predicted yield of die 602 at the selected location can be determined based on the average yield and deviation associated with the pixel elements in the location.

As depicted in FIG. 6, in the present exemplary embodiment, if the pixel elements in the selected location have different average yields, then the average yield associated with the lowest deviation is selected. For example, die 602 is depicted as being placed in a selected location with two groupings of pixel elements—one grouping with yields between 0 and 10 percent and a deviation of 0 percent, and another grouping with yields greater than 10 and less than 20 percent and a deviation of 10 percent. Thus, in the present example, the average yield selected as predicting the yield of die 602 is between 0 and 10 percent.

Additionally, in the present exemplary embodiment, if the pixel elements in the selected location have different average yields and the deviations of the pixel elements are the same or within a determined range, the average yields of the pixel elements are averaged. For example, assume that one grouping of pixel elements in FIG. 6 has a yield of 99 percent and a deviation of 0.56, and another grouping of pixel elements has a yield of 80 percent and a deviation of 0.57. Assume also that the determined range is 0.05. Thus, in the present example, the predicted yield of die 602 is 89.5 percent (the average of 99 percent and 80 percent).

Although exemplary embodiments have been described, various modifications can be made without departing from the spirit and/or scope of the present invention. Therefore, the present invention should not be construed as being limited to the specific forms shown in the drawings and described above.

I claim:

1. A method of mapping yield information of semiconductor dice, the method comprising:

obtaining yield information of a first die that was formed on a first location on a first wafer in accordance with a first die placement;

obtaining yield information of a second die that was formed on a second location on a second wafer in accordance with a second die placement, wherein the first die placement and the second die placement have different layouts;

wherein a portion of the first location corresponds to a portion of the second location such that the portion of the first location would overlap with the portion of the second location if the first location was on the second wafer;

defining a plurality of pixel elements, wherein each pixel element corresponds to a different location on a wafer, and wherein at least one of the plurality of pixel elements corresponds to the portion of the first location that corresponds to the portion of the second location;

determining an average yield for the at least one of the plurality of pixel elements based on the yield information of the first die and the second die; and determining a deviation for the at least one of the plurality of pixel elements based on the average yield of the at least one of the plurality of pixel elements and the yield information of the first die and the second die.

2. The method of claim 1, wherein the first die and the second die are different products produced by the same process.

3. The method of claim 1, further comprising:
obtaining yield information of a first set of dice formed on locations on the first wafer;
obtaining yield information of a second set of dice formed on locations on the second wafer,
wherein locations on the first wafer correspond with locations on the second wafer such that locations on the first wafer would overlap with locations on the second wafer if the locations on the first wafer were on the second wafer, and
wherein the plurality of pixel elements correspond to the overlapping locations;
determining an average yield for each of the plurality of pixel elements based on the yield information of the first set of dice and the second set of dice; and
determining a deviation for each of the plurality of pixel elements based on the average yield of each of the plurality of pixel elements and the yield information of the first set of dice and the second set of dice.

4. The method of claim 3, further comprising:
obtaining yield information of a plurality of additional sets of dice formed on locations on a plurality of additional wafers,
wherein the locations on the plurality of additional wafers overlap, and
wherein the plurality of pixel elements correspond to the overlapping locations;
determining an average yield for each of the plurality of pixel elements based on the yield information of the plurality of additional sets of dice; and
determining a deviation for each of the plurality of pixel elements based on the average yield of each of the plurality of pixel elements and the yield information of the plurality of additional sets of dice.

5. The method of claim 4, wherein the average yield for a pixel element is determined as a sum of the yield information of all the dice in a location corresponding to the pixel element divided by the number of dice in the location, and wherein the deviation for the pixel element is determined as a percentage of deviation of the yield information of all the dice in the location.

6. The method of claim 3, further comprising:
identifying a location of interest; and
grouping pixel elements around the location of interest based on the average yield and deviation of the pixel elements.

7. The method of claim 6, wherein grouping pixel elements around the location of interest is ceased when the average yield or the deviation of the pixel elements is greater than an established limit.

8. The method of claim 6, wherein the location of interest corresponds to a location on a wafer that interacts with a processing equipment used to process the wafer.

9. The method of claim 8, wherein the processing equipment includes a clamp, wafer scribe, wafer identification, or nitride injector.

10. The method of claim 6, further comprising:
determining a third die placement based on the plurality of pixel elements.

11. The method of claim 10, further comprising:
determining a predicted yield of a die in the third die placement based on the average yields and deviations of the plurality of pixel elements.

12. The method of claim 11, further comprising:
determining the predicted yield of the die based on the average yield and deviation of one or more pixel elements corresponding to the location of the die.

13. The method of claim 12, further comprising:
when the location of the die corresponds to two or more pixel elements, selecting the yield of the pixel element with the lowest deviation.

14. The method of claim 13, further comprising:
when the location of the die corresponds to two or more pixel elements and the deviations of the two or more pixel elements are the same or within a determined range, averaging the yields of the two or more pixel elements to determine the predicted yield of the die.

15. The method of claim 1, further comprising:
normalizing the yield information of the first die and the second die, wherein the average yield and the deviation for the at least one of the plurality of pixel elements are determined based on the normalized yield information of the first die and the second die.

16. The method of claim 15, wherein the yield information of the first die and the second die are normalized using a linear function that takes into account average yield.

17. A method of mapping yield information of semiconductor dice, the method comprising:
obtaining yield information of a first set of dice that was formed on a first set of locations on a first set of wafers in accordance with a first die placement;
obtaining yield information of a second set of dice that was formed on a second set of locations on a second set of wafers in accordance with a second die placement,
wherein the first die placement and the second die placement have different layouts;
wherein a portion of the first set of locations corresponds to a portion of the second set of locations such that the portion of the first set of locations would overlap with the portion of the second set of locations if the first set of locations was on the second set of wafers;
defining a plurality of pixel elements, wherein each pixel element corresponds to a different location on a wafer, and wherein the plurality of pixel elements corresponds to the portion of the first set of locations that corresponds to the portion of the second set of locations;
determining an average yield for each of the plurality of pixel elements based on the yield information of the first set of dice and the second set of dice; and
determining a deviation for each of the plurality of pixel elements based on the average yield of each of the plurality of pixel elements and the yield information of the first set of dice and the second set of dice.

18. The method of claim 17, wherein the first set of dice and the second set of dice are different products produced by the same process.

19. The method of claim 17, wherein the average yield for a pixel element is determined as a sum of the yield information of all the dice in a location corresponding to the pixel element divided by the number of dice in the location, and wherein the deviation for the pixel element is determined as a percentage of deviation of the yield information of all the dice in the location.

20. The method of claim 17, further comprising:
identifying a location of interest; and
grouping pixel elements around the location of interest based on the average yield and deviation of the pixel elements.

21. The method of claim 20, wherein grouping pixel elements around the location of interest is ceased when the average yield or the deviation of the pixel elements is greater than an established limit.

22. The method of claim 20, wherein the location of interest corresponds to a location on a wafer that interacts with a processing equipment used to process the wafer.

23. The method of claim 22, wherein the processing equipment includes a clamp, wafer scribe, wafer identification, or nitride injector.

24. The method of claim 20, further comprising:
determining a third die placement based on the plurality of pixel elements.

25. The method of claim 24, further comprising:
determining a predicted yield of a die in the third die placement based on the average yields and deviations of the plurality of pixel elements.

26. The method of claim 25, further comprising:
determining the predicted yield of the die based on the average yield and deviation of one or more pixel elements corresponding to the location of the die.

27. The method of claim 26, further comprising:
when the location of the die corresponds to two or more pixel elements, selecting the yield of the pixel element with the lowest deviation.

28. The method of claim 26, further comprising:
when the location of the die corresponds to two or more pixel elements and the deviations of the two or more pixel elements are the same or within a determined range, averaging the yields of the two or more pixel elements to determine the predicted yield of the die.

29. The method of claim 17, further comprising:
normalizing the yield information of the first set of dice and the second set of dice, wherein the average yield and the deviation for each of the plurality of pixel elements are determined based on the normalized yield information of the first set of dice and the second set of dice.

30. The method of claim 29, wherein the yield information of the first set of dice and the second set of dice are normalized using a linear function that takes into account average yield.

31. A map of yield information of semiconductor dice, the map comprising:
a plurality of pixel elements, wherein each pixel element corresponds to a different location on a wafer, and wherein the plurality of pixel elements corresponds to a portion of a first set of locations on a first set of wafers that corresponds to a portion of a second set of locations on a second set of wafers such that the portion of the first set of locations would overlap with the portion of the second set of locations if the first set of locations was on the second set of wafers;
an average yield associated with each of the plurality of pixel elements, wherein the average yield is determined based on yield information of a first set of dice that was formed on the first set of locations on the first set of wafers in accordance with a first die placement and a second set of dice that was formed on the second set of locations on the second set of wafers in accordance with a second die placement, wherein the first die placement and the second die placement have different layouts; and
a deviation associated with each of the plurality of pixel elements, wherein the deviation is determined based on the average yield of each of the plurality of pixel elements and the yield information of the first set of dice and the second set of dice, wherein the first set of dice and the second set of dice have different placements.

32. The map of claim 31, wherein the first set of dice and the second set of dice are different products produced by the same process.

33. The map of claim 31, wherein the average yield for each of the plurality of pixel elements is determined as a sum of the yield information of all the dice in a location corresponding to the pixel element divided by the number of dice in the location, and wherein the deviation for the pixel element is determined as a percentage of deviation of the yield information of all the dice in the location.

34. The map of claim 31, further comprising:
a location of interest; and
a grouping of pixel elements around the location of interest, wherein the grouping is determined based on the average yield and deviation of the pixel elements.

35. The map of claim 34, wherein the grouping of pixel elements around the location of interest is ceased when the average yield or the deviation of the pixel elements is greater than an established limit.

36. The map of claim 34, wherein the location of interest corresponds to a location on a wafer that interacts with a processing equipment used to process the wafer.

37. The map of claim 36, wherein the processing equipment includes a clamp, wafer scribe, wafer identification, or nitride injector.

38. The map of claim 31, further comprising:
a third die placement determined based on the plurality of pixel elements.

39. The map of claim 38, further comprising:
a predicted yield associated with a die in the third die placement, the predicted yield determined based on the average yields and deviations of the plurality of pixel elements.

40. The map of claim 39, wherein the predicted yield of the die is determined based on the average yield and deviation of one or more pixel elements corresponding to the location of the die.

41. The map of claim 40, wherein when the location of the die corresponds to two or more pixel elements, the yield of the pixel element with the lowest deviation is selected as the predicted yield of the die.

42. The method of claim 41, wherein when the location of the die corresponds to two or more pixel elements and the deviations of the two or more pixel elements are the same or within a determined range, an average of the yields of the two or more pixel elements is selected as the predicted yield of the die.

43. The map of claim 31, wherein the average yield and the deviation for the at least one of the plurality of pixel elements are determined based on normalized yield information of the first set of dice and the second set of dice.

44. The map of claim 43, wherein the normalized yield information of the first set of dice and the second set of dice comprises actual yields of the first set of dice and the second of dice divided by average yields of the first set of dice and the second set of dice.

45. The map of claim 44, wherein the normalized yield information of the first set of dice and the second set of dice are normalized using a linear or nonlinear function that takes into account average yield.

* * * * *